United States Patent
Wang et al.

(10) Patent No.: US 6,972,370 B2
(45) Date of Patent: Dec. 6, 2005

(54) MOUNTING DEVICE FOR MOUNTING EXPANSION CARDS IN COMPUTER ENCLOSURE

(75) Inventors: Wen-Tang Wang, Tu-Chen (TW); Cheng-Lung Cheng, Tu-chen (TW); Jun-Xiong Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/946,722

(22) Filed: Sep. 21, 2004

(65) Prior Publication Data

US 2005/0135055 A1   Jun. 23, 2005

(30) Foreign Application Priority Data

Dec. 23, 2003  (CN) ...................... 200320125400 A

(51) Int. Cl.[7] ............................. H02G 3/08; H05K 5/00
(52) U.S. Cl. ...................... 174/52.1; 361/801; 361/686
(58) Field of Search ....................... 174/52.1; 361/683, 361/686, 801

(56) References Cited

U.S. PATENT DOCUMENTS

| | | | |
|---|---|---|---|
| 4,745,524 A | 5/1988 | Patton, III | |
| 5,317,483 A | 5/1994 | Swindler | |
| 5,640,309 A | * 6/1997 | Carney et al. | ............... 361/801 |
| 5,673,175 A | * 9/1997 | Carney et al. | ............... 361/686 |
| 5,748,453 A | * 5/1998 | Carney et al. | ............... 361/801 |
| 5,936,835 A | 8/1999 | Astier | |
| 6,173,843 B1 | * 1/2001 | Christensen et al. | ...... 211/41.17 |
| 6,552,913 B2 | * 4/2003 | Tournadre | .................... 361/759 |
| 6,608,765 B2 | 8/2003 | Vier et al. | |

FOREIGN PATENT DOCUMENTS

| | | |
|---|---|---|
| TW | 89209215 | 11/2001 |
| TW | 89216651 | 4/2002 |

* cited by examiner

*Primary Examiner*—Hung V. Ngo
(74) *Attorney, Agent, or Firm*—Wei Te Chung

(57) ABSTRACT

A mounting device (10) is for mounting expansion cards with cover plates (30) to a card cage (60) of a rear panel (80). Each cover plate includes an elongated portion (32) and a bent portion (34). The mounting device includes an elongated main body (12) with one end pivotally attached to the card cage, and the other end locked to the rear panel. A plurality of resilient fingers (122) is formed at an inner face of the main body for pressing the bent portions of the cover plate. A flexible pressing post (126) extends outwardly from a free end of each finger. A cover panel (90) is attached to the rear panel and presses the pressing posts to further secure the cover plates.

19 Claims, 3 Drawing Sheets

MOUNTING DEVICE FOR MOUNTING EXPANSION CARDS IN COMPUTER ENCLOSURE

BACKGROUND OF THE INVENTION

1. Field of the Invention

The present invention relates to a mounting device for mounting expansion cards in a computer enclosure, and particularly to a mounting device which readily secures a plurality of expansion cards in a computer enclosure and allows convenient removal of the expansion cards therefrom.

2. Description of the Related Art

In order to upgrade the operating capabilities of a personal computer, a plurality of expansion cards is operatively installed in the computer enclosure. Typical types of expansion cards include network cards, sound cards, graphics accelerator cards and multi-media cards, etc. These expansion cards may be installed in the computer enclosure during its original manufacture or by the computer purchaser.

U.S. Pat. No. 4,745,524 discloses a plurality of mounting systems for mounting a plurality of expansion cards inside a computer chassis. Each mounting system includes a pressing element and a screw to secure a separate cover plate of a corresponding expansion card. However, installing screws one by one is time-consuming and cumbersome. Moreover, during installation/removal of the expansion cards, one or more of the screws can easily fall into the crowded interior of the computer, thereby creating a difficult retrieval problem.

Another conventional mounting device is disclosed in U.S. Pat. No. 5,317,483. The mounting device includes an elongated locking bar with one end rotatably connected to a rear panel of the computer enclosure, and the other end movably secured to the rear panel, therefore a plurality of cover plates is pressed by the locking bar. However, said other end of the locking bar is secured to the rear panel by a fixing screw which increases inconvenience in installation/removal process. Additionally, because the locking bar is flat and slim, and the series of cover plates might be on different heights, the locking bar will fail to press on the cover plates which are on a lower position. Therefore, the untouched, lower positioned cover plates might not be securely attached to the rear panel. When suffered from shock or vibration, the cover plates will easily break away from the rear panel.

Thus an improved mounting device which overcomes the above-mentioned problems is desired.

BRIEF SUMMARY OF THE INVENTION

Accordingly, an object of the present invention is to provide a mounting device which readily and conveniently attaches a series of expansion cards to a computer enclosure, and allows ready detachment therefrom.

Another object of the present invention is to provide a mounting device which permits simultaneously locking or unlocking of all expansion cards.

A further object of the present invention is to provide a mounting device which can securely lock the series of expansion cards on different height.

To achieve the above-mentioned objects, a mounting device of the preferred embodiment of the present invention is used for mounting a plurality of expansion cards with cover plates to a card cage of a rear panel. Each cover plate comprises an elongated portion and a bent portion. The mounting device comprises an elongated main body with one end pivotally attached to the card cage, and the other end locked to the rear panel. A plurality of resilient fingers is formed at an inner face of the main body for pressing the bent portions of the cover plate. A flexible pressing post extends outwardly from a free end of each finger. A cover panel is attached to the rear panel and presses the pressing posts to further secure the cover plates.

Other objects, advantages and novel features of the present invention will be drawn from the following detailed description of the preferred embodiments of the present invention with the attached drawings, in which:

DETAILED DESCRIPTION OF THE INVENTION

Figure 1:
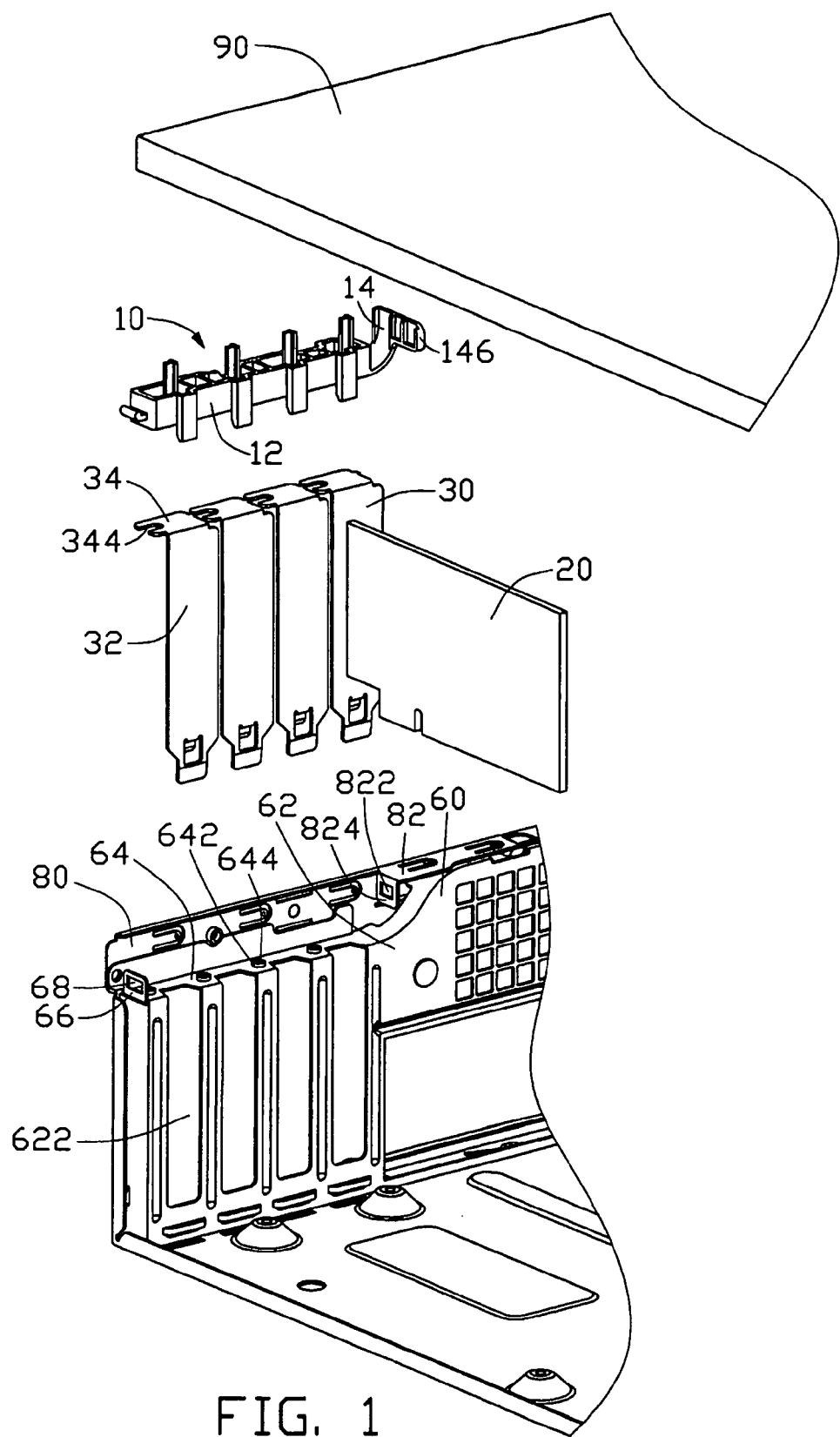
FIG. 1 is an exploded, isometric view of a mounting device in accordance with the preferred embodiment of the present invention, together with a plurality of cover plates for expansion cards, and an computer enclosure.
Figure 2:
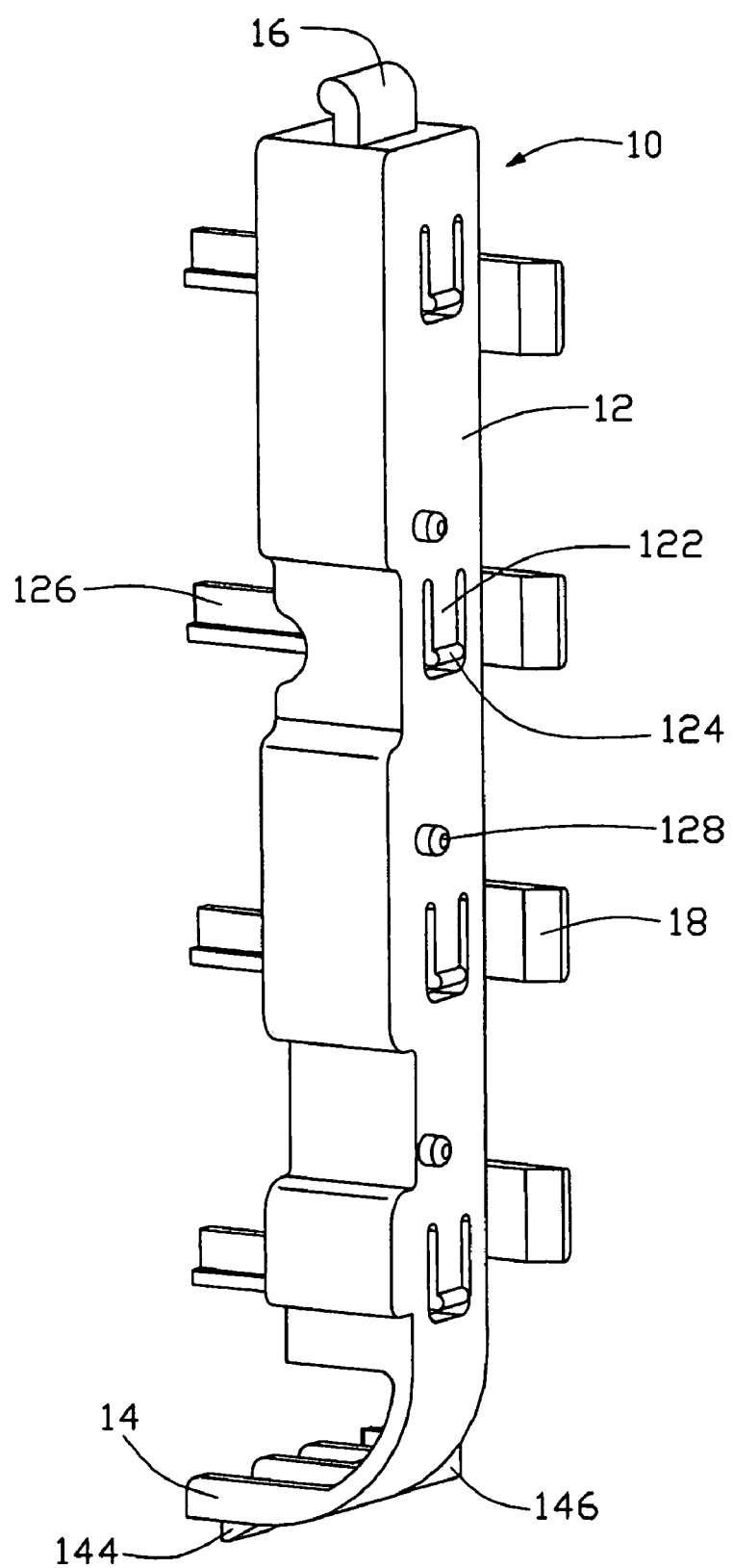
FIG. 2 is an enlarged view of the mounting device of FIG. 1.
Figure 3:
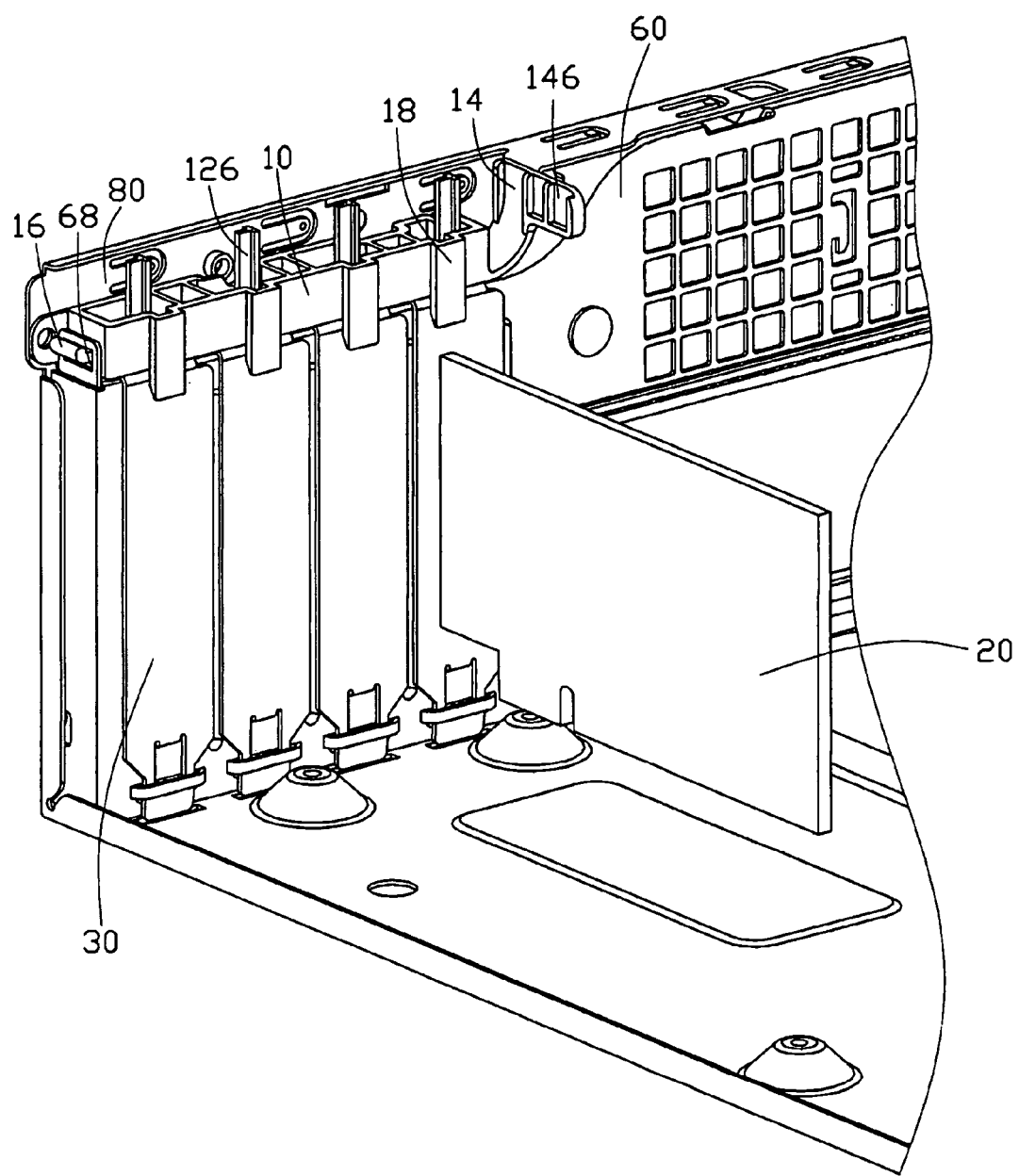
FIG. 3 an assembled view of FIG. 1.

Referring to FIGS. 1–3, a mounting device 10 in accordance with the preferred embodiment of the present invention is used to fix a plurality of expansion cards 20 with cover plates 30 to an inturned card cage 60 which is attached to a rear panel 80 of a computer enclosure. Each cover plate 30 comprises a rectangular elongated portion 32 connected to the expansion card 20, and a bent portion 34 extending perpendicularly from one end of the elongated portion 32. A cutout 344 is defined in the bent portion 34.

The card cage 60 comprises a base wall 62, and a bent wall 64 extending perpendicularly from the base wall 62. A plurality of expansion card slots 622 is defined in the base wall 62 parallel to each other, and further extends to the bent wall 64, having a similar profile with the cover plates 30. A flange 82 is bent perpendicularly from an edge of the rear panel 80. A locking tab 824 extends perpendicularly from the flange 82 towards the bent wall 64 of the card cage 60. A rectangular locking hole 822 is defined in the locking tab 824. A plurality of positioning posts 642 is formed on the bent wall 64. A positioning hole 644 is defined in each post 642. A mounting tab 66 with a rectangular mounting hole 68 defined therein is formed perpendicularly from an end of the bent wall 64.

The mounting device 10 comprises an elongated main body 12, and a locking arm 14 extending perpendicularly from one end of the main body 12. A distal end of the locking arm 14 is bent outwardly to form a handle 146 for facilitating manual operation. A wedge-shaped block 144 is formed from an outer surface of the locking arm 14, corresponding to the locking hole 822 of the rear panel 80. A generally L-shaped hook 16 is formed from the other end of the main body 12, and extends in a direction the same with the direction in which the locking arm 14 extends. The main body 12 has an inner face corresponding to the bent portions 34 of the cover plates 30. A plurality of evenly spaced resilient fingers 122 are stamped to form in the inner face. Each resilient finger 122 is a cantilever, having a protrusion 124 at a free end thereof for pressing the bent portion 34 of a corresponding cover plate 30. A pressing post 126 extends outwardly from said free end of each finger 122. A plurality of evenly spaced positioning nubs 128 is formed at the inner face of the main body 12, alternating with the fingers 122.

One lateral side of the main body 12 extends a plurality of pressing tabs 18 for pressing or abutting against the elongated portions 32 of the cover plates 30.

In assembly, the hook 16 of the mounting device 10 is inserted in the mounting hole 68 of the card cage 60, therefore the mounting device 10 can pivot around the hook 14. Then the cover plates 30 with expansion cards 20 are attached to the slots 622 of the card cage 60. The cutouts 344 of the expansion cards 30 receives the positioning posts 642 of the card cage 60. Draw the handle 146 to rotate the mounting device 10, so that the block 144 of the locking arm 14 engages in the locking hole 822 of the locking tab 824 of the rear panel 80. Simultaneously, the positioning nubs 128 of the mounting device 10 are received in the positioning holes 644 of the positioning posts 642 of the card cage 60; the protrusions 124 of the resilient fingers 122 of the mounting device 10 are pressing the bent portions 34 of the cover plates 30; the pressing tabs 18 of the mounting device 10 are abutting against the elongated portions 32 of the cover plates 30. Thus, all the cover plates 30 are securely attached to the slots 622 of the card cage 60.

A cover panel 90 such as a side panel of the computer enclosure is then attached to the rear panel 80 via conventional means; the cover panel 90 abuts against or asserts force to free ends of pressing posts 126. The pressing posts 126 have flexibility. Because the height of the expansion cards 20 might not be uniform, the bent portions 34 of the cover plates 30 might not be coplanar. The resilient fingers 122 of the mounting device 10 can offset the different levels of the bent portions 34 of the cover plates 30, thereby tightly pressing the cover plates 30 to the card cage 60. In the case of large height-differences between the cover plates 30, the resilient fingers 122 might not be able to offset the height-differences. The flexible pressing posts 126 being pressed by the cover panel 90 can urge the resilient fingers 122 to the bent portions 34 of the cover plates 30, thereby the cover plates 30 are tightly secured to the card cage 60. Furthermore, the cover panel 90 can prevent the mounting device 10 from accidentally falling from the rear panel 80.

In disassembly, simply draw the handle 146 to disengage the block 144 from the locking hole 822, and rotate the mounting device 10 away the card cage 60, then the cover plates 30 together with the expansion cards 20 can be easily taken away from the card cage 60. During the disassembly process, the mounting device 10 is connected in the mounting hole 68, therefore, when the cover plates 30 are attached to the slots 622 again, simply rotate the mounting device 10 towards the card cage 60 and engage the block 144 in the locking hole 822 to complete assembly. The whole process is convenient, simple, and can decrease cost and save manpower.

The mounting device 10 of the present invention can be pivotally attached to the card cage 60 by other means, and can also be pivotally attached to other places other than the card cage 60. For example, the mounting device 10 can be directly attached to a bottom panel of the computer enclosure.

The card cage 60 of the present invention can be integrally formed from the rear panel 80 of the computer enclosure.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A mounting assembly for mounting a plurality of expansion cards with cover plates to a computer enclosure, each of the cover plates having an elongated portion and a bent portion, the mounting assembly comprising:
   a rear panel having a card cage, the card cage comprising a base wall to support the cover plates, and a bent wall; and
   a mounting device having an elongated main body, the main body having one end pivotally attached to the computer enclosure and the other end locked to the computer enclosure, an inner face of the mounting device comprising a plurality of resilient pressing portions to press the bent portions of the cover plates, a pressing post extending outwardly from each of the pressing portions; and
   a cover panel attached to the computer enclosure and pressing the pressing posts.

2. The mounting assembly as described in claim 1, wherein said one end of the main body of the mounting device forms a hook for pivotally engaging with the computer enclosure.

3. The mounting assembly as described in claim 2, wherein one end of the bent wall of the card cage is bent outwardly to form a mounting tab, a rectangular mounting hole is defined in the mounting tab for pivotally accommodating the hook of the mounting device therein.

4. The mounting assembly as described in claim 1, wherein a flange of the rear panel is bent inwardly to form a locking tab with a rectangular locking hole defined therein.

5. The mounting assembly as described in claim 4, wherein said other end of the main body of the mounting device is bent outwardly to form a locking arm, a block is formed at the locking arm to engage in the locking hole of the rear panel.

6. The mounting assembly as described in claim 5, wherein the block of the locking arm is generally wedge-shaped, and is formed inwardly from an outer surface of the locking arm.

7. The mounting assembly as described in claim 5, wherein a handle is formed from the locking arm of the mounting device for facilitating manual operation.

8. The mounting assembly as described in claim 1, wherein the pressing portions of the mounting device are cantilever like, a protrusion is formed inwardly from a free end of each of the pressing portions.

9. The mounting assembly as described in claim 8, wherein said pressing post is located at said free end of each of the pressing portions, said pressing post has flexibility.

10. The mounting assembly as described in claim 1, wherein said inner face of the mounting device forms a plurality of positioning nubs, the bent wall of the card cage forms a plurality of positioning posts, a positioning hole is defined in each of the positioning posts to receive a corresponding position nub, the bent portion of each of the cover plates defines a cutout for extension of a corresponding positioning post.

11. A mounting assembly for mounting a plurality of expansion cards with cover plates to a computer enclosure, each of the cover plates having an elongated portion and a bent portion, the mounting assembly comprising:
    a rear panel having a card cage, the card cage comprising a base wall to support the cover plates, and a bent wall; and
    a mounting device having an elongated main body, an inner face of the main body forming a plurality of resilient pressing portions to press the cover plates, the pressing portions are cantilever like, a pressing post extending outwardly from a free end of each of the pressing portions; and a cover panel attached to the computer enclosure.

12. The mounting assembly as described in claim 11, wherein one end of the main body of the mounting device forms a hook for pivotally engaging with the computer enclosure, the other end of the main body is locked with the computer enclosure.

13. The mounting assembly as described in claim 12, wherein one end of the bent wall of the card cage is bent outwardly to form a mounting tab, a rectangular mounting hole is defined in the mounting tab for pivotally accommodating the hook of the mounting device therein.

14. The mounting assembly as described in claim 12, wherein a flange of the rear panel is bent inwardly to form a locking tab with a rectangular locking hole defined therein.

15. The mounting assembly as described in claim 14, wherein said other end of the main body of the mounting device is bent outwardly to form a locking arm, a block is formed at the locking arm to engage in the locking hole of the rear panel.

16. The mounting assembly as described in claim 14, wherein a handle is formed from the locking arm of the mounting device for facilitating manual operation.

17. The mounting assembly as described in claim 11, wherein each of the resilient fingers is cantilever like, and forms a protrusion at a free end thereof.

18. The mounting assembly as described in claim 11, wherein a plurality of pressing tabs is formed from a lateral side of the mounting device to abut against the elongated portions of the cover plate.

19. A mounting assembly comprising:

a plurality of expansion cards with cover plates attachable to a computer enclosure, each of the cover plates having an elongated portion and a bent portion, the bent portion defining a plurality of notches;

a rear panel having a card cage, the card cage comprising a base wall to support the cover plates, and a bent wall to support the bent portion, the bent wall defining a plurality of hollow posts received in the corresponding notches, respectively; and a mounting device pivotally mounted to the rear panel, and having an elongated main body with a pivotal end around a lengthwise end of said bent wall, said main body being pivotal about an axis which extends in a direction perpendicular to the base wall, an inner face of the main body forming a plurality of positioning nubs respectively received in the corresponding hollow posts, respectively, when said mounting device is located in a locking position where the bent portion is sandwiched between the bent wall and the main body in a vertical direction.

* * * * *